United States Patent [19]

Ehrgott

[11] Patent Number: 4,767,343
[45] Date of Patent: Aug. 30, 1988

[54] ELECTRICAL CONNECTION PIN FOR SURFACE-MOUNTABLE ELECTRICAL COILS

[75] Inventor: Roland Ehrgott, Munich, Fed. Rep. of Germany

[73] Assignee: Siemens Aktiengesellschaft, Berlin and Munich, Fed. Rep. of Germany

[21] Appl. No.: 72,765

[22] Filed: Jul. 13, 1987

[30] Foreign Application Priority Data

Aug. 11, 1986 [DE] Fed. Rep. of Germany ....... 3627210

[51] Int. Cl.$^4$ ............................ H01R 9/09; H01R 4/02
[52] U.S. Cl. ...................................... 439/83; 336/192; 439/736
[58] Field of Search ............... 439/78, 83, 736, 869, 439/874, 876, 527, 529, 540, 542, 569, 571, 722, 884, 888, 890, 908, 620; 336/192

[56] References Cited

U.S. PATENT DOCUMENTS

| | | | |
|---|---|---|---|
| 2,513,305 | 7/1950 | Gagnier et al. | 439/722 |
| 2,823,372 | 2/1958 | Jones | 439/78 |
| 2,899,631 | 8/1959 | Cushman | 336/192 |
| 2,962,678 | 11/1960 | Gellert et al. | 336/192 |
| 3,215,964 | 11/1965 | Horbach | 336/198 |
| 3,284,258 | 11/1966 | Patti | 439/722 |
| 3,524,156 | 8/1970 | Horbach | 336/192 |
| 3,781,741 | 12/1973 | Weiner | 336/192 |
| 4,135,297 | 1/1979 | Guttenberger et al. | 336/192 |
| 4,354,310 | 10/1982 | Hatton | 336/192 |
| 4,678,250 | 7/1987 | Romine et al. | 439/83 |

FOREIGN PATENT DOCUMENTS 2644406  4/1978  Fed. Rep. of Germany .

Primary Examiner—Gil Weidenfeld
Assistant Examiner—Gary F. Paumen
Attorney, Agent, or Firm—Hill, Van Santen, Steadman & Simpson

[57] ABSTRACT

Electrical connection pin for surface-mountable electrical coils which has one end embedded in a coil member web and has its other free end attached to a circuit board. The connection pin is fashioned with flat end faces, particularly flanges, and is fashioned symmetrical in reference to a plane perpendicular to a longitudinal axis of the connection pin and passing through the longitudinal center of the connection pin.

7 Claims, 1 Drawing Sheet

U.S. Patent    Aug. 30, 1988    4,767,343
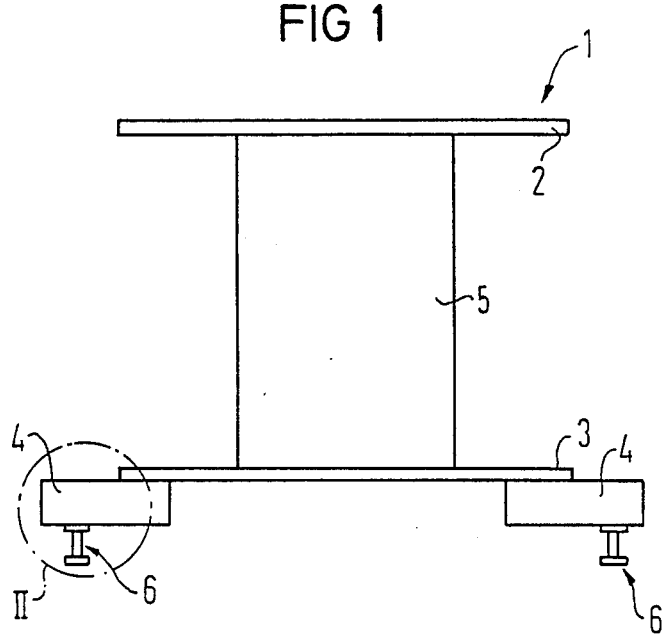
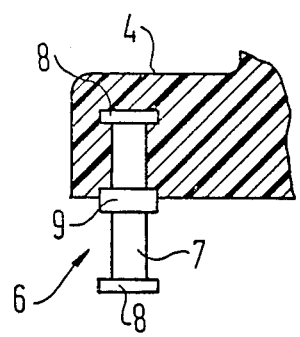

ELECTRICAL CONNECTION PIN FOR SURFACE-MOUNTABLE ELECTRICAL COILS

BACKGROUND OF THE INVENTION

This invention is directed to an electrical connection pin for surface-mountable electrical coils which has one end embedded in a coil member and which has the other free end attached to a circuit card or circuit board.

SMD techniques are increasingly gaining in significance in the course of progressive automation; i.e. components are being applied to an interconnect side of a circuit card to an increasing degree and are usually mounted thereon by flow soldering. New circuit designs utilizing automatic equipping machines and a broad spectrum of component parts enable the transition to this new structuring technique.

The need for surface-mountability for electrical coils, transformers, inductors and the like, whose winding wires are wound around terminal legs and are subsequently secured to circuit boards by, for example, dip soldering or flow soldering, is embraced by this development.

SUMMARY OF THE INVENTION

It is therefore an object of the present invention to provide connection pins for electrical coils and the like which meet all the requirements of surface mountability of component parts, and which can be used in automatic equipping machines.

For achieving this object, the invention provides an electrical connection pin fashioned with flat end faces, particularly flanges, and which is symmetrical in reference to a plane through the longitudinal center and perpendicular to the longitudinal axis of the connection pin.

As a result of the axially symmetrical design of the connection pin which is predominantly composed of a copper-tin alloy, an automatic feed into an injection molding die is possible when the connection pin is to be embedded in a coil member web. As a result of the symmetry, the same conditions always prevail regardless of whether the connection pin has one or the other face part or flat end face embedded in the coil member. The connection pin itself and its end faces fashioned as flanges can thereby have a circular or polygonal cross-section.

The connection pin preferably comprises an annular collar in its longitudinal center which is concentric to the longitudinal axis of the connection pin and which is injection molded into the coil member flange, up to about half the collar height.

The component parts having these connection pins are surface mounted on a circuit board by bath, reflow, condensation (vapor phase) or hot gas soldering.

BRIEF DESCRIPTION OF THE DRAWINGS

The features of the present invention which are believed to be novel, are set forth with particularly in the appended claims. The invention, together with further objects and advantages, may best be understood by reference to the following description taken in conjunction with the accompanying drawings, in the several Figures in which like reference numerals identify like elements, and in which:

FIG. 1 is a side view of a coil body having connection pins structured according to the present invention; and FIG. 2 is a partially cut away view of the connection pin embedded in a coil member web.

BRIEF DESCRIPTION OF THE PREFERRED EMBODIMENT

The coil body 1 of FIG. 1 comprises a winding member 5, coil body flanges 2 and 3 applied to the face ends thereof, and webs 4 attached to the coil body flange 3. These webs 4 are thicker than the coil body flange 3. Connection pins 6 are placed into or injection molded into these webs 4 and are shown in magnified scale in FIG. 2.

The connection pins 6 comprises a pin part 7, a collar 9 located in the longitudinal center of this pin part 7, and flat end faces or flanges 8. The connection pin (as may be seen from the drawing) is fashioned axially symmetrical; i.e., in reference to a plane perpendicular to the longitudinal middle axis of the connection pin, the two axis halves are mirror images. Supplying these connection pins to the injection molding die always results in the proper positioning of the connection pin regardless of the end which is embedded in the web of the coil body flange.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An electrical connection pin for surface-mountable electrical coils which has its one end embedded in a coil member web and has its other free end connected to a circuit board, the connection pin being fashioned with flat end faces and being symmetrical in reference to a plane perpendicular to the longitudinal axis of the connection pin and passing through a longitudinal center of the connection pin, and the connection pin end faces each being fashioned as a flange.

2. The electrical connection pin according to claim 1, wherein said connection pin further comprises an annular collar in its longitudinal center which is concentric to the longitudinal axis of said connection pin.

3. The electrical connection pin according to claim 1, wherein said connection pin has a polygonal cross-section.

4. The electrical connection pin according to claim 2, wherein said connection pin is embedded in the coil member web up to about half the collar height.

5. An electrical connection pin for surface-mountable electrical coils, said connection pin for mounting a coil member web of the electrical coil to a circuit board, comprising:
   first end having a flange;
   second end having a flange;
   annular collar in a longitudinal center of said connection pin and concentric to a longitudinal axis of the connection pin;
   said connection pin being symmetrical in reference to a plane through the longitudinal center of and perpendicular to the longitudinal axis of the connection pin; and
   said first end embedded in the coil member web to a depth of approximately half the height of said annular collar, said second end being free such that said second end may be connected to the circuit board.

6. The electrical connection pin according to claim 5, wherein said connection pin has a polygonal cross-section.

7. The electrical connection pin according to claim 5, wherein said first end has a substantially identical structure to said second end.

* * * * *